United States Patent
Kim et al.

(10) Patent No.: US 9,173,316 B2
(45) Date of Patent: Oct. 27, 2015

(54) FLEXIBLE DISPLAY APPARATUS AND METHOD OF MANUFACTURING THE SAME

(71) Applicant: Samsung Display Co., Ltd., Yongin, Gyeonggi-do (KR)

(72) Inventors: Ki-Seo Kim, Yongin (KR); Hak-Sun Kim, Yongin (KR); Won-Sang Park, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 297 days.

(21) Appl. No.: 13/706,070

(22) Filed: Dec. 5, 2012

(65) Prior Publication Data

US 2014/0043734 A1 Feb. 13, 2014

(30) Foreign Application Priority Data

Aug. 9, 2012 (KR) .................. 10-2012-0087355

(51) Int. Cl.
| | | |
|---|---|---|
| *G02F 1/1333* | (2006.01) | |
| *H05K 7/02* | (2006.01) | |
| *H05K 13/00* | (2006.01) | |
| *G02F 1/1335* | (2006.01) | |
| *G06F 1/16* | (2006.01) | |
| *H01L 51/00* | (2006.01) | |
| *H01L 51/52* | (2006.01) | |

(52) U.S. Cl.
CPC ............ *H05K 7/02* (2013.01); *G02F 1/133308* (2013.01); *G02F 1/133608* (2013.01); *G06F 1/1643* (2013.01); *G06F 1/1652* (2013.01); *H01L 51/0097* (2013.01); *H01L 51/524* (2013.01); *H05K 13/00* (2013.01); *H01L 2251/5338* (2013.01); *Y02E 10/549* (2013.01)

(58) Field of Classification Search
CPC .................... G02F 1/133308; G02F 1/133608
USPC ........................................................... 349/58
See application file for complete search history.

(56) References Cited

U.S. PATENT DOCUMENTS

| 7,505,092 B2 | 3/2009 | Ichioka et al. | |
|---|---|---|---|
| 2008/0198298 A1* | 8/2008 | Jeong et al. | 349/65 |
| 2012/0228644 A1* | 9/2012 | Hunze et al. | 257/79 |

FOREIGN PATENT DOCUMENTS

| JP | 2005-189571 A | 7/2005 |
|---|---|---|
| JP | 2006-71972 A | 3/2006 |
| KR | 10-0652735 B1 | 11/2006 |
| KR | 10-0921960 B1 | 10/2009 |

OTHER PUBLICATIONS

Machine Translation of JP 2005-189571—Nitto Denko Corp. Jul. 14, 2005.*

* cited by examiner

*Primary Examiner* — Phu Vu
(74) *Attorney, Agent, or Firm* — Knobbe, Martens, Olson & Bear, LLP (57) ABSTRACT

A flexible display apparatus is disclosed. In one aspect, the apparatus includes a flexible display panel including a first surface, a second surface facing the first surface, and a side surface that connects the first surface and the second surface. The apparatus also includes a passivation layer that is disposed on at least one of the first surface, the second surface, and the side surface of the display panel and includes a viscoelastic fluid and a vessel unit that contains the viscoelastic fluid therein.

21 Claims, 7 Drawing Sheets

FLEXIBLE DISPLAY APPARATUS AND METHOD OF MANUFACTURING THE SAME

CROSS-REFERENCE TO RELATED PATENT APPLICATION

This application claims the benefit of Korean Patent Application No. 10-2012-0087355, filed on Aug. 9, 2012, in the Korean Intellectual Property Office, the disclosure of which is incorporated herein in its entirety by reference.

BACKGROUND

1. Field

The described technology generally relates to a flexible display apparatus and a method of manufacturing the flexible display apparatus.

2. Description of the Related Technology

Display apparatuses generally include televisions (TVs), computer monitors, personal digital assistants (PDAs), tablet computers and smartphones which are increasingly in demand, and these display apparatuses display an image corresponding to a signal input by an external device.

A flat panel display module with high image quality, such as an organic light-emitting display panel, a liquid crystal display (LCD) panel, a plasma display panel (PDP), or the like, is used in display apparatuses.

Recently, flexible displays which can be manufactured to be lightweight and thin and have high portability have been developed. However, in order to manufacture a flexible display device, a thin substrate needs to be employed, and thus, the manufactured flexible display is vulnerable to an external impact.

SUMMARY

One inventive aspect is a flexible display apparatus with durability against instantaneous impact and improved touch sensitivity and methods of manufacturing the flexible display apparatus.

Another aspect is a flexible display apparatus including: a display panel that has flexibility and includes a first surface, a second surface facing the first surface, and a side surface that connects the first surface and the second surface; and a passivation layer that is disposed on at least one of the first surface, the second surface, and the side surface of the display panel and includes a viscoelastic fluid and a vessel unit that contains the viscoelastic fluid therein.

The viscoelastic fluid may be a non-Newtonian fluid.

The vessel unit may include at least one division part that defines the viscoelastic fluid.

The vessel unit may include a first vessel unit including at least one first division part that defines the viscoelastic fluid and a second vessel unit that is disposed to cross the first division part and includes at least one second division part.

The vessel unit may have flexibility.

The display panel may display an image on the first surface and the passivation layer is disposed on the second surface.

The passivation layer may be disposed so as to surround the second surface and the side surface.

The flexible display apparatus may further include a touch panel on any one surface of the first surface and the second surface of the display panel, on which an image is displayed.

The passivation layer may be disposed so as to surround the side surface of the display panel.

The display panel may include a display region in which an image is displayed and a non-display region that is located outside the display region, and the passivation layer is disposed on a region corresponding to the non-display region.

The display panel may include: a flexible substrate; an organic light-emitting device disposed on the flexible substrate; and an encapsulation thin film that encapsulates the organic light-emitting device.

The viscoelastic fluid may include any one of a colloid solution, a silicon polymer solution, and a viscoelastic polymer solution.

Another aspect is a method of manufacturing a flexible display apparatus, the method including: preparing a display panel that has flexibility and includes a first surface, a second surface facing the first surface, and a side surface that connects the first surface and the second surface; and forming a passivation layer that is disposed on at least one of the first surface, the second surface, and the side surface of the display panel and includes a viscoelastic fluid and a vessel unit that contains the viscoelastic fluid therein.

The forming may include forming a passivation layer comprising a vessel unit comprising at least one division part that defines the viscoelastic fluid.

The forming of the passivation layer may include forming a passivation layer comprising a first vessel unit comprising at least one first division part that defines the viscoelastic fluid and a second vessel unit that is disposed to cross the first division part and includes at least one second division part.

The display panel may display an image on the first surface, and the forming may include forming a passivation layer on the second surface of the display panel.

The forming of the passivation layer may include forming a passivation layer so as to surround the second surface and the side surface of the display panel.

The method may further include forming a touch panel on any one surface of the first surface and the second surface of the display panel, on which an image is displayed.

The forming may include forming a passivation layer so as to surround the side surface of the display panel.

The display panel may include a display region in which an image is displayed and a non-display region that is located outside the display region, and the forming may include forming a passivation layer on a region corresponding to the non-display region.

The preparing may include forming an organic light-emitting device on a flexible substrate; and forming an encapsulation thin film that encapsulates the organic light-emitting device.

DETAILED DESCRIPTION

Hereinafter, embodiments will be described in detail with reference to the accompanying drawings. As used herein, the term "and/or" includes any and all combinations of one or more of the associated listed items. Expressions such as "at least one of," when preceding a list of elements, modify the entire list of elements and do not modify the individual elements of the list.

Figure 1:
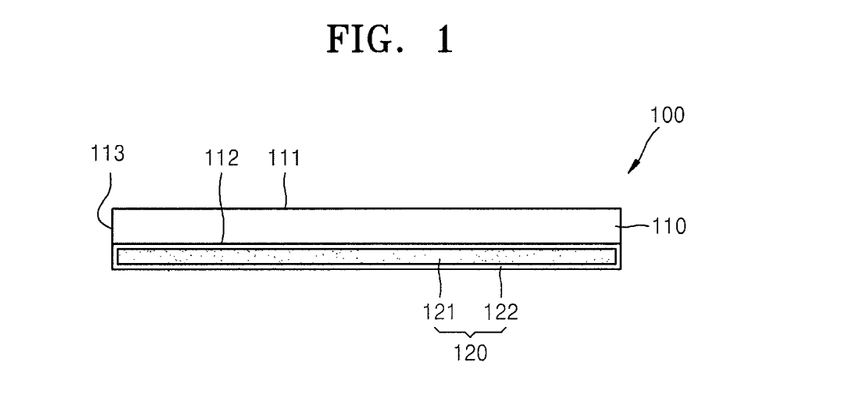
FIG. 1 is a cross-sectional view of a flexible display apparatus according to an embodiment.
Figure 2:
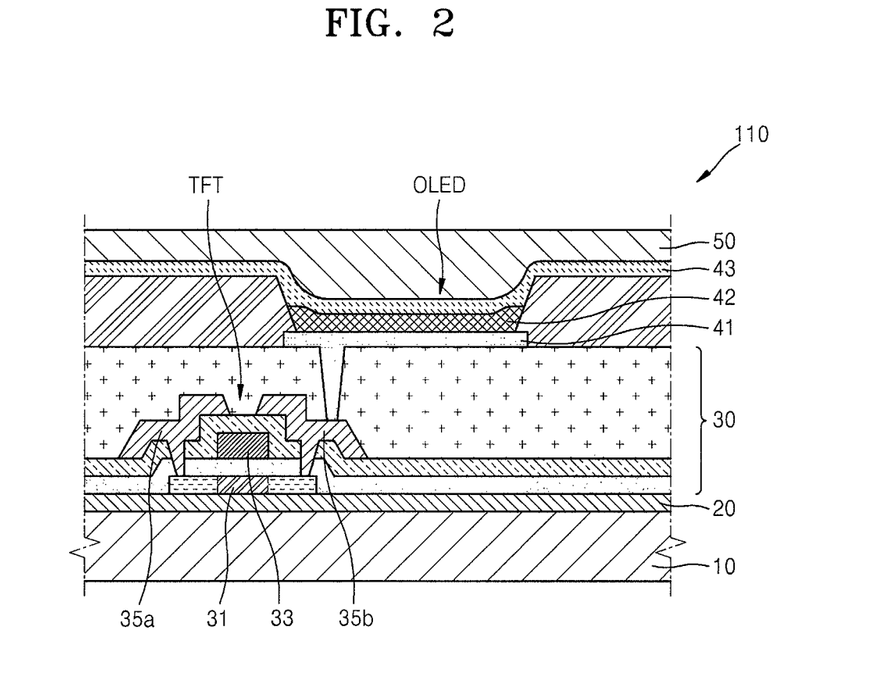
FIG. 2 is a schematic cross-sectional view of a pixel region included in the flexible display apparatus of FIG. 1, according to an embodiment.

FIG. 1 is a cross-sectional view of a flexible display apparatus 100 according to an embodiment. FIG. 2 is a schematic cross-sectional view of a pixel region included in the flexible display apparatus 100 of FIG. 1, according to an embodiment.

Referring to FIGS. 1 and 2, the flexible display apparatus 100 includes a display panel 110 that has flexibility and includes a first surface 111, a second surface 112 facing the first surface 111, and a side surface 113 that connects the first and second surfaces 111 and 112; and a passivation layer 120 including a viscoelastic fluid 121 that is disposed on the second surface 112 of the display panel 110 and a vessel unit 122 that contains the fluid 121 therein.

The display panel 110 may include a flexible substrate 10, an organic light-emitting device (OLED) disposed on the flexible substrate 10, and an encapsulation thin film 50 disposed on the OLED.

In addition, a barrier layer 20 and a device/wiring layer 30 disposed on the barrier layer 20 may be disposed between the flexible substrate 10 and the OLED.

The flexible substrate 10 may be formed of a plastic with good thermal resistance and durability, such as polyethylene terephthalate (PET), polyimide, polycarbonate, polyethylene naphtalate, polyarylate (PAR), or polyetherimide, but is not limited thereto. For example, the flexible substrate 10 may be formed of various flexible materials.

The barrier layer 20 may be disposed on the flexible substrate 10 so as to prevent external impurities such as moisture or oxygen from permeating from the flexible substrate 10 into the device/wiring layer 30 and the OLED.

The device/wiring layer 30 may be disposed on the barrier layer 20, and the device/wiring layer 30 may include a driving thin film transistor (TFT) that drives the OLED, a switching TFT (not shown), and a capacitor (not shown).

The driving TFT includes an active layer 31, a gate electrode 33, a source electrode 35a, and a drain electrode 35b.

The OLED is disposed on the device/wiring layer 30. The OLED may include a pixel electrode 41, an organic light-emitting layer 42 on the pixel electrode 41, and a counter electrode 43 on the organic light-emitting layer 42, and may be electrically connected to the driving TFT.

The encapsulation thin film 50 may be disposed on the counter electrode 43. The encapsulation thin film 50 may include a multi-layered inorganic film or an inorganic film and an organic film. The encapsulation thin film 50 protects the OLED from external moisture and oxygen.

Light emitted from the organic light-emitting layer 42 included in the OLED may be emitted towards the flexible substrate 10 and/or the encapsulation thin film 50, i.e., the first surface 111 and/or the second surface 112 of the display panel 110.

In the flexible display apparatus 100 according to the present embodiment, an image is displayed on the first surface 111 of the display panel 110, and the passivation layer 120 is disposed on the second surface 112 facing the first surface 111.

The passivation layer 120 includes the viscoelastic fluid 121 and the vessel unit 122 that contains the viscoelastic fluid 121 therein.

The vessel unit 122 may be formed of various flexible materials, for example, plastic or silicon which has good thermal resistance and durability.

The vessel unit 122 is filled with the viscoelastic fluid 121. The term "viscoelastic" as used herein refers to a phenomenon in which properties of liquid and solid are simultaneously exhibited, and particularly, properties of both being elastic and being viscous when a force is applied to an object.

The viscoelastic fluid 121 of the flexible display apparatus 100 may be formed of a material having a higher viscosity than elasticity, and thus, is disposed on the second surface 112 of the display panel 110 with being filled in the vessel unit 122.

The fluid 121 may include at least one of a colloid solution, a silicon polymer solution, and a viscoelastic polymer solution, and viscous and elastic properties of materials may be adjusted by adjusting types, concentrations, and temperatures of solvents and solutes.

The viscoelastic fluid 121 may also be a non-Newtonian fluid. The term "non-Newtonian fluid" as used herein refers to a fluid having different fluidic properties from a Newtonian fluid and a fluid in which a strain rate against the shear stress are not proportionate.

Therefore, in the flexible display apparatus 100 including the fluid 121, the fluid 121 exhibits elasticity against an external instantaneous impact, and thus, the external impact is alleviated and dispersed. Accordingly, breakdown of devices included in the flexible display apparatus 100 due to the deformation of the flexible display apparatus 100 may be prevented.

In addition, the viscoelastic fluid 121 exhibits viscosity against a gradually applied force rather than an instantaneous impact, and thus, the flexible display apparatus 100 may be changed to a desired shape according to the intensity and direction of the force. Therefore, although the passivation layer 120 including the viscoelastic fluid 121 is employed in the flexible display apparatus 100, the flexibility of the flexible display apparatus 100 may be maintained the same.

Figure 11:
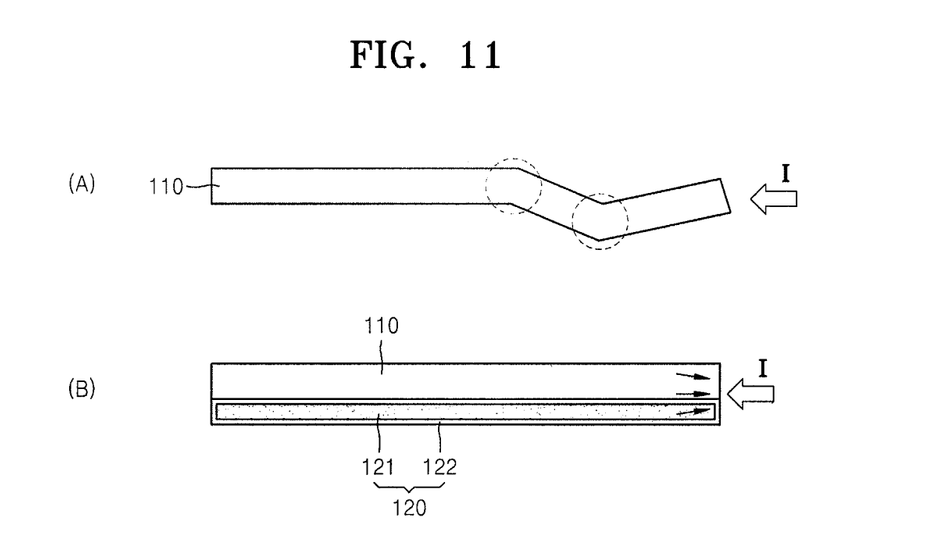
FIGS. 11A and 11B are conceptual views for comparing impact-mitigating effects of a flexible display apparatus of a comparative example and the flexible display apparatus of FIG. 1, according to embodiments.
Figure 13:
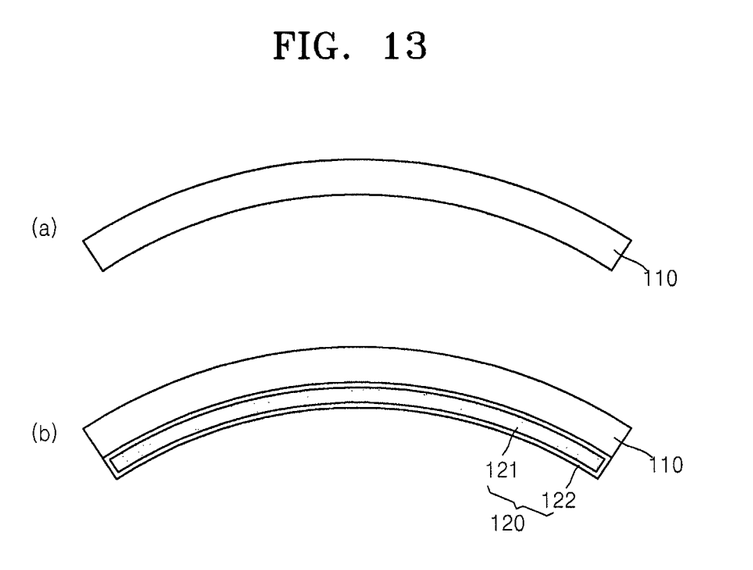
FIGS. 13A and 13B are conceptual views for comparing flexibilities of a flexible display apparatus of a comparative example and the flexible display apparatus of FIG. 1, according to embodiments.

A detailed description of the above-described configuration will be provided in the description below with reference to FIGS. 11 and 13.

In FIG. 1, it is illustrated that the passivation layer 120 is formed on the entire second surface 112 of the display panel 110, but the disposition of the passivation layer 120 is not limited thereto. For example, the passivation layer 120 may be disposed on a portion of the second surface 112, or a plurality of the passivation layers 120 may be disposed spaced apart from one another.

Hereinafter, a method of manufacturing the flexible display apparatus 100 according to the present embodiment will be described briefly.

The method of manufacturing the flexible display apparatus 100 include preparing the display panel 110 that has flexibility and includes a first surface 111, a second surface 112 facing the first surface 111, and a side surface 113 that connects the first and second surfaces 111 and 112; and forming on the display panel 110 the passivation layer 120 including the viscoelastic fluid 121 and the vessel unit 122 that contains the viscoelastic fluid 121 therein.

The preparing process may include forming the OLED on the flexible substrate 10 and forming the encapsulation thin film 50 that encapsulates the OLED.

In this regard, the display panel 110 displays an image on the first surface 111 thereof, and the passivation layer 120 may be formed on the second surface 112 of the display panel 110.

Each element of the flexible display apparatus 100 has been described above, and thus, a detailed description thereof will not be repeated herein.

Figure 3:
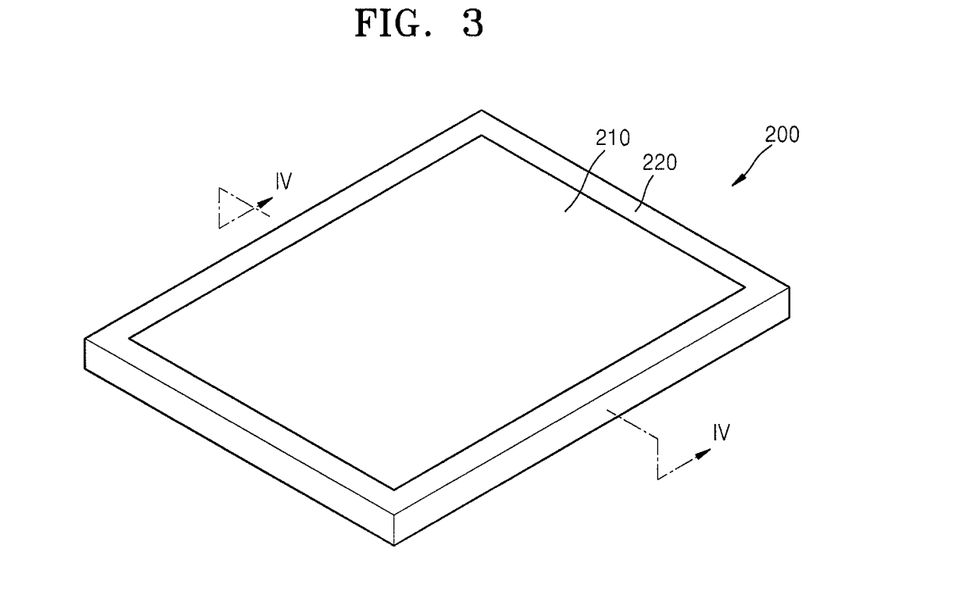
FIG. 3 is a perspective view of a flexible display apparatus according to another embodiment.
Figure 4:
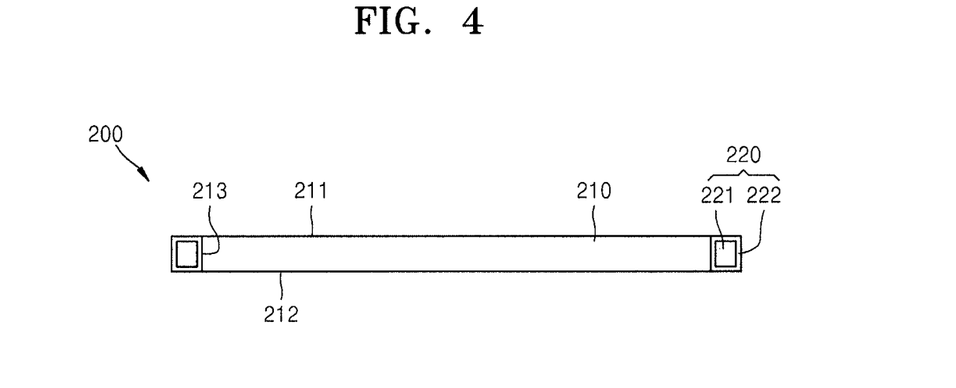
FIG. 4 is a cross-sectional view taken along a line IV-IV of the flexible display apparatus of FIG. 3, according to an embodiment.

FIG. 3 is a perspective view of a flexible display apparatus 200 according to another embodiment. FIG. 4 is a cross-sectional view taken along a line IV-IV of the flexible display apparatus 200 of FIG. 3, according to an embodiment.

Referring to FIGS. 3 and 4, the structure of the flexible display apparatus 200 is the same as that of the flexible display apparatus 100 of FIG. 1, except for the position of a passivation layer 220.

In the present embodiment, the passivation layer 220 is disposed so as to surround side surfaces 213 of a display panel 210 that has flexibility. In this regard, the display panel 210 may display an image on a first surface 211 or a second surface 212 thereof, and may be a dual view display panel that displays an image on the first and second surfaces 211 and 212 thereof.

In addition, the display panel 210 may include an OLED, but the structure thereof is not limited thereto. For example, the display panel 210 may include any display panels with flexibility, liquid crystal display panels, plasma display panels, and electrophoresis display panels.

The passivation layer 220 protects the display panel 210 from external instantaneous impact, and thus, is disposed so as to surround the side surfaces 213 of the display panel 210, which are vulnerable to external impact.

The passivation layer 220 may include a viscoelastic fluid 221 and a vessel unit 222 that contains the viscoelastic fluid 221 therein.

Due to the structure described above, the passivation layer 220 may effectively protect the flexible display apparatus 200 from an external impact. In addition, the passivation layer 220 may be disposed on the first surface 211 or the second surface 212 of the display panel 210, and thus, deterioration of the flexibility of the flexible display apparatus 200 due to the passivation layer 220 may be prevented.

In addition, the flexible display apparatus 200 may be suitably used as a dual light-emitting type flexible display apparatus.

In the flexible display apparatus 200 according to the present embodiment, the passivation layer 220 is disposed so as to substantially completely surround the side surfaces 213 of the display panel 210, but is not limited thereto. For example, the passivation layer 220 may be disposed so as to partially surround the side surfaces 213 of the display panel 210, or a plurality of the passivation layers 220 may be disposed spaced apart from one another.

Figure 5:
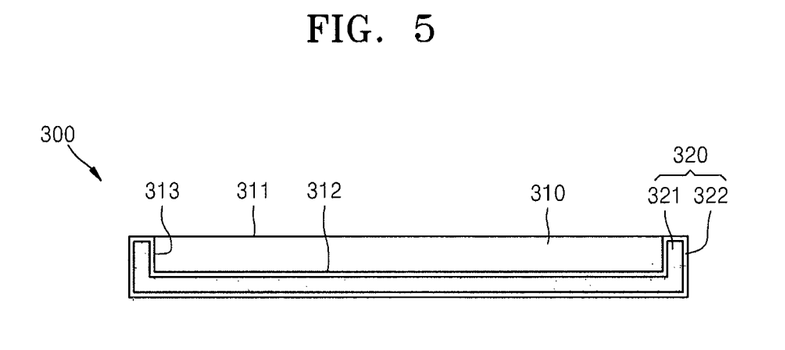
FIG. 5 is a cross-sectional view of a flexible display apparatus according to another embodiment.

FIG. 5 is a cross-sectional view of a flexible display apparatus 300 according to another embodiment.

Referring to FIG. 5, a passivation layer 320 included in the flexible display apparatus 300 is disposed so as to surround a second surface 312 and side surfaces 313 of a display panel 310 with flexibility. The passivation layer 320 includes a viscoelastic fluid 321 and a vessel unit 322 that contains the viscoelastic fluid 321 therein.

Due to the structure described above, the flexible display apparatus 300 may be protected satisfactorily from an external impact.

Figure 6:
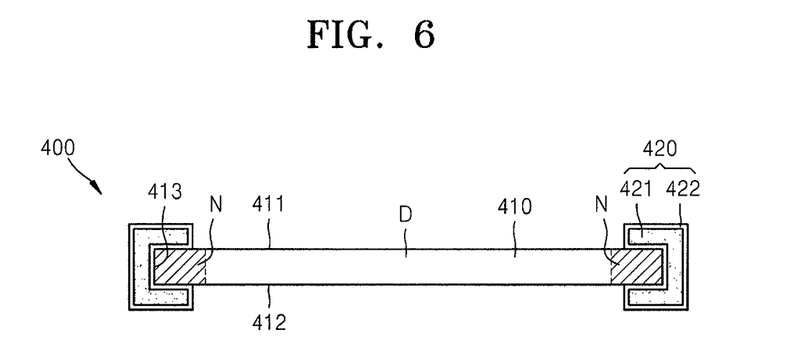
FIG. 6 is a cross-sectional view of a flexible display apparatus according to another embodiment.

FIG. 6 is a cross-sectional view of a flexible display apparatus 400 according to another embodiment.

Referring to FIG. 6, the flexible display apparatus 400 includes a display panel 410 and a passivation layer 420 including a viscoelastic fluid 421 and a vessel unit 422 that contains the viscoelastic fluid 421 therein.

In this regard, the display panel 410 includes a display region D in which an image is displayed and a non-display region N that is located outside the display region D, and the passivation layer 420 is disposed on a region corresponding to the non-display region N.

The display region D is disposed on a center portion of the display panel 410, and the non-display region N may be arranged along an edge of the display region D. Any kinds of circuits (not shown) and wirings (not shown) may be located in the non-display region N so as to control the display region D to display an image.

The passivation layer 420 may be disposed on a portion of each of a first surface 411 and a second surface 412 and side surfaces 413 of the display panel 410, which correspond to the non-display region N. In this regard, the passivation layer 420 may be disposed so as to substantially completely or partially surround the side surfaces 413 of the display panel 410. Alternatively, a plurality of the passivation layers 420 may be disposed spaced apart from one another.

Due to the structure described above, the passivation layer 420 may effectively protect the side surfaces 413 of the flexible display apparatus 400 from an external impact, and deterioration of the flexibility of the flexible display apparatus 400 may be prevented.

In addition, the passivation layer 420 is disposed only on a region corresponding to the non-display region N, and thus, does not affect light emitted from the display panel 410.

Figure 7:
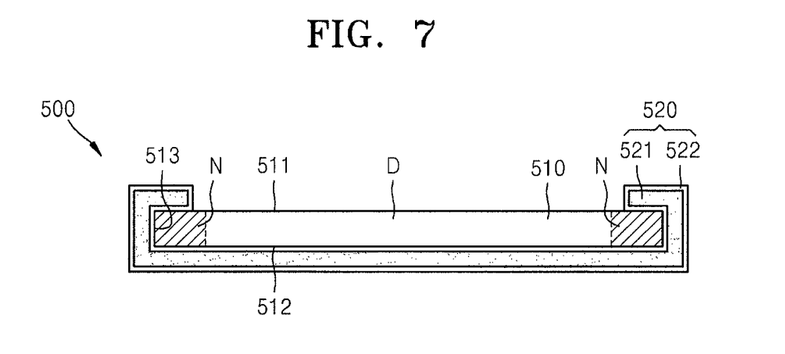
FIG. 7 is a cross-sectional view of a flexible display apparatus according to another embodiment.

FIG. 7 is a cross-sectional view of a flexible display apparatus 500 according to another embodiment.

Referring to FIG. 7, a passivation layer 520 included in the flexible display apparatus 500 is disposed so as to surround a region corresponding to a display region D and non-display region N of a second surface 512 of a display panel 510 with flexibility, a region corresponding to a non-display region N of a first surface 511 of the display panel 510, and side surfaces 513. The passivation layer 520 includes a viscoelastic fluid 521 and a vessel unit 522 that contains the viscoelastic fluid 521 therein.

Figure 8:
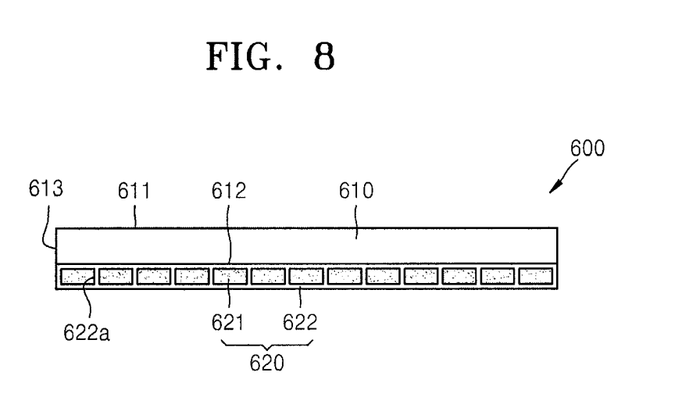
FIG. 8 is a cross-sectional view of a flexible display apparatus according to another embodiment.

FIG. 8 is a cross-sectional view of a flexible display apparatus 600 according to another embodiment.

Referring to FIG. 8, the flexible display apparatus 600 includes a display panel 610 including a first surface 611 and a second surface 612 facing the first surface 611 and a passivation layer 620 that is disposed on the second surface 612 of the display panel 610 and includes viscoelastic fluids 621 and a vessel unit 622 that contains the viscoelastic fluids 621 therein.

In this regard, the vessel unit 622 may include at least one division parts 622a that define the viscoelastic fluids 621.

In one embodiment, the viscoelastic fluids 621 included in the flexible display apparatus 600 have a relatively higher viscosity than elasticity in order to enhance flexibility, as described above, and thus, the viscoelastic fluids 621 may flow in one direction by gravity and/or an external force.

In one embodiment, the viscoelastic fluids 621 contained in the vessel unit 622 are not dispersed at a uniform density over an entire region, and thus, the properties of the viscoelastic fluids 621 may vary according to positions of the flexible display apparatus 600.

In this embodiment, however, the flexible display apparatus 600 includes the vessel unit 622 including the division parts 622a that define the viscoelastic fluids 621, and thus, the one-directional flow of the viscoelastic fluids 621 may be restricted.

In addition, in the present embodiment, a plurality of the division parts 622a are substantially linearly arranged in substantially parallel to one another, but are not limited thereto. For example, the division parts 622a may be alternately arranged with respect to one another in a substantially linear or curved form.

Figure 9:
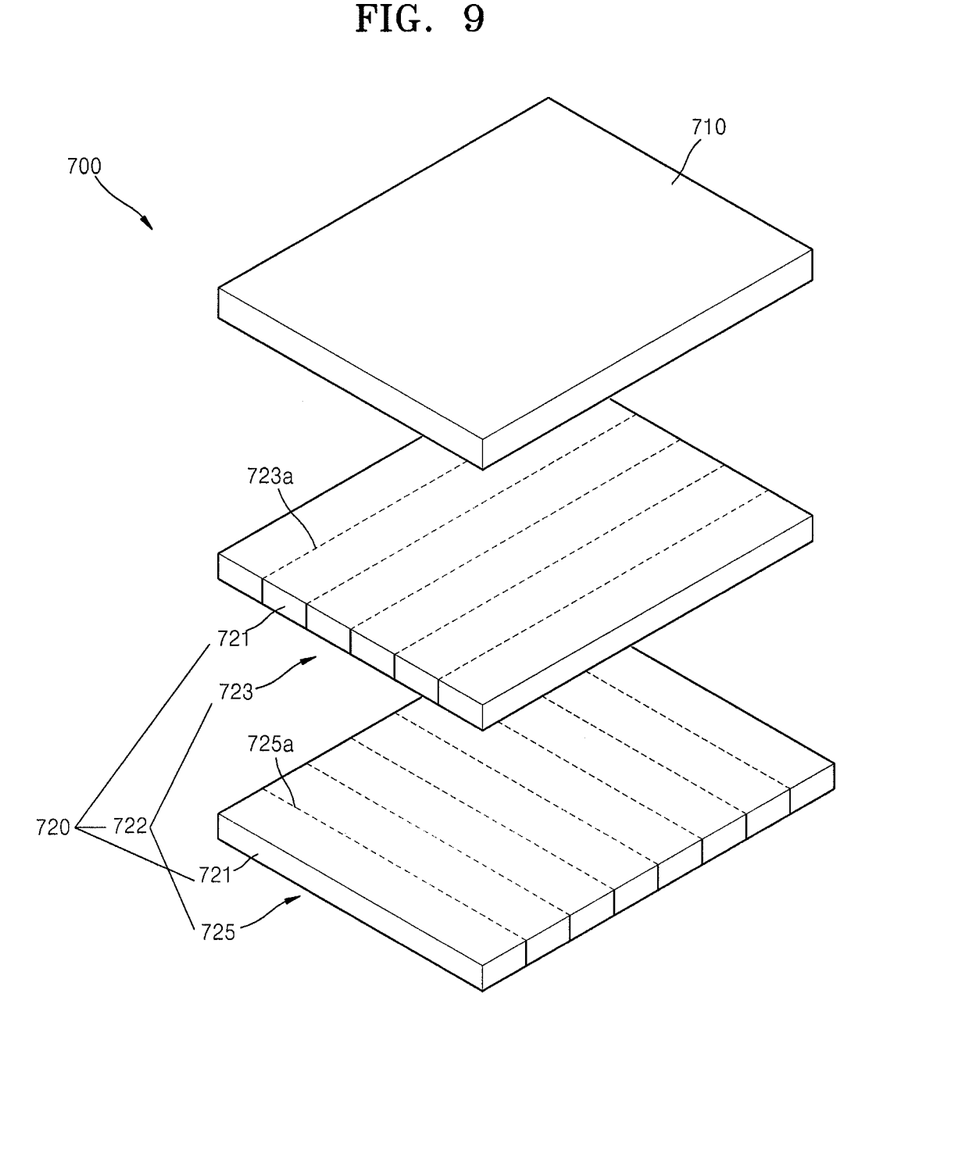
FIG. 9 is an exploded perspective view of a flexible display apparatus according to another embodiment.

FIG. 9 is an exploded perspective view of a flexible display apparatus 700 according to another embodiment.

Referring to FIG. 9, the flexible display apparatus 700 includes a display panel 710 and a passivation layer 720. The passivation layer 720 includes viscoelastic fluids 721 and a vessel unit 722 that contains the viscoelastic fluids 721 therein. The vessel unit 722 includes a first vessel unit 723 including first division parts 723a that define the respective viscoelastic fluids 721 and a second vessel unit 725 including second division parts 725a that define the respective viscoelastic fluids 721 and are disposed to cross the first division parts 723a.

In this regard, the first and second vessel units 723 and 725 are bonded together, and then may be disposed on a surface of the display panel 710.

In the flexible display apparatus 700, the first and second division parts 723a and 725a are disposed in the first vessel unit 723 and the second vessel unit 725, respectively, and thus, the one-directional flow of the viscoelastic fluids 721 may be prevented. In addition, the second division parts 725a are disposed to cross the first division parts 723a, and thus, it may be prevented that the elasticity of the viscoelastic fluids 721 has directivity due to arrangement of the viscoelastic fluids 721 along one direction.

In the present embodiment, the first division parts 723a and the second division parts 725a may be disposed substantially perpendicular to each other, but are not limited thereto.

Figure 10:
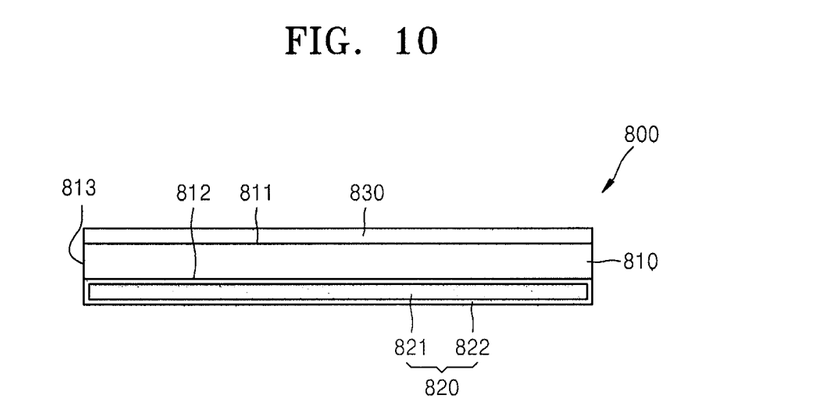
FIG. 10 is a cross-sectional view of a flexible display apparatus according to another embodiment.

FIG. 10 is a cross-sectional view of a flexible display apparatus 800 according to another embodiment.

The flexible display apparatus 800 includes a display panel 810 including a first surface 811 and a second surface 812 facing the first surface 811, in which a touch panel 830 is disposed on the first surface 811 of the display panel 810 on which an image is displayed, and a passivation layer 820 including a viscoelastic fluid 821 and a vessel unit 822 is disposed on the second surface 812 of the display panel 810.

The touch panel 830 is an input member that senses the touch of a finger, a touch pen, or the like and transmits the touch to the display panel 810, may be a capacitance touch panel, a resistive touch panel, an optical touch panel, or the like.

As for the touch panel 830, it is important to accurately sense a position where the touch occurs. When the touch panel 830 is deformed by an external force, however, it is difficult to sense an accurate position and the sensitivity of an input signal is decreased.

In the present embodiment, however, the flexible display apparatus 800 includes the passivation layer 820, and thus, the deformation of the touch panel 830 due to the external force may be prevented, resulting in an improved touch sensitivity. This will be described below in detail.

In addition, a transparent passivation window (not shown) may be further disposed on the touch panel 830.

FIGS. 11A and 11B are conceptual views for comparing impact-mitigating effects of a flexible display apparatus of a comparative example and the flexible display apparatus 100 of FIG. 1, according to embodiments.

Referring to FIG. 11A, a thin substrate is employed in order to achieve the flexibility of a display panel 110, and thus, deformations, such as folding, and the like, may occur due to an external instantaneous impact I.

When the deformation of the display panel 110 is more than a critical limit, breakdown of devices included in the display panel 110 occurs.

Referring to FIG. 11B, the passivation layer 120 is disposed on the display panel 110, and thus, an external instantaneous impact I may be mitigated and dispersed by elasticity of the viscoelastic fluid 121 contained in the passivation layer 120.

Thus, when the external instantaneous impact I occurs, an elastic force against the external instantaneous impact I occurs, thereby preventing the display panel 110 from being deformed. Therefore, the breakdown of devices included in the display panel 110 may be prevented.

Figure 12:
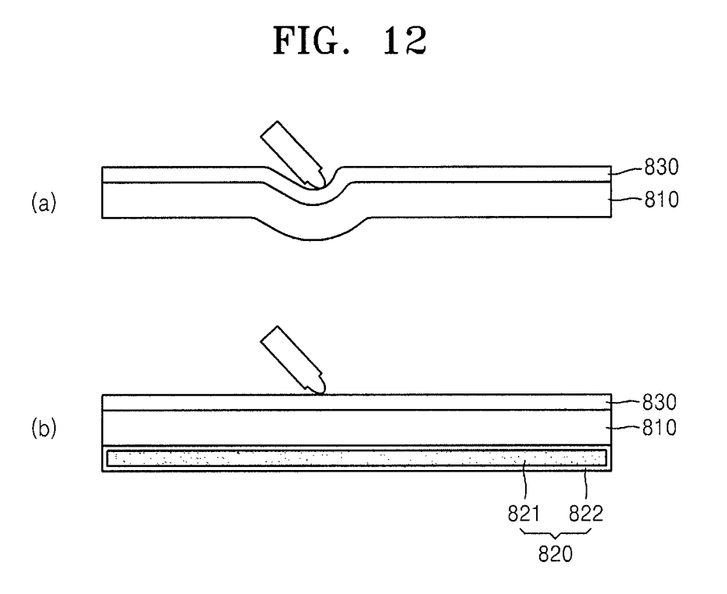
FIGS. 12A and 12B are conceptual views for comparing touch sensitivities of a flexible display apparatus of a comparative example and the flexible display apparatus of FIG. 10, according to embodiments.

FIGS. 12A and 12B are conceptual views for comparing touch sensitivities of a flexible display apparatus of a comparative example and the flexible display apparatus 800 of FIG. 10, according to embodiments.

Referring to FIG. 12A, a touch panel 830 is disposed on a surface of a display panel 810 on which an image is displayed, and a force by a touch pen 840 is applied to the touch panel 830.

In this regard, the touch panel 830 may be operated in a tapping manner, for example, in a capacitance manner, and the display panel 810 and the touch panel 830 are so flexible that the display panel 810 and/or the touch panel 830 may be deformed by the touch pen 840.

Therefore, it is difficult to accurately sense a desired position that is touched by a user and the sensitivity of an input signal is reduced.

Referring to FIG. 12B, the passivation layer 820 including the viscoelastic fluid 821 and the vessel unit 822 is disposed on a surface of the display panel 810 which is opposite to a surface of the display panel 810 on which the touch panel 830 is disposed, and thus, the deformation of the display panel 810 and/or the touch panel 830 by a touch pen 840 may be prevented by the elasticity of the viscoelastic fluid 821.

Due to the structure described above, a touch sensitivity and an accuracy may be improved.

FIGS. 13A and 13B are conceptual views for comparing flexibilities of a flexible display apparatus of a comparative example and the flexible display apparatus of FIG. 1, according to embodiments.

Referring to FIGS. 13A and 13B, when a force is gradually applied to the display panel 110, instead of applying an instantaneous impact, the display panel 110 may be changed to a desired shape according to the intensity and direction of the applied force both in a case where the passivation layer 120 is not formed (See FIG. 13A) and a case where the passivation layer 120 is formed (See FIG. 13B).

The flexible display apparatuses 100, 200, 300, 400, 500, 600, 700 and 800 according to the embodiments described above include the viscoelastic fluids 121, 221, 321, 421, 521, 621, 721 and 821 on the display panel 110, 210, 310, 410, 510, 610, 710 and 810, and thus, the flexibilities of the flexible display apparatuses 100, 200, 300, 400, 500, 600, 700 and 800 may be maintained and the durabilities thereof against an external instantaneous impact may be improved.

In addition, the flexible display apparatus 800 including the touch panel 800 may have an improved touch sensitivity and accuracy.

As described above, according to at least one of the disclosed embodiments, a flexible display apparatus employs a viscoelastic fluid on a flexible display panel, and thus, the flexibility of the flexible display apparatus may be maintained and the durability thereof against an external instantaneous impact may be improved. A method of manufacturing the flexible display apparatus is also provided.

In addition, a flexible display apparatus including a touch panel may have an improved touch sensitivity.

In the drawings, the sizes of elements may be exaggerated or decreased for clarity and convenience of understanding, and thus, the disclosed embodiments should not be construed as limited to the sizes or shapes of the elements illustrated in the drawings. While the above embodiments have been described with reference to the accompanying drawings, it will be understood by those of ordinary skill in the art that various changes in form and details may be made therein without departing from the scope of the following claims.

What is claimed is:

1. A flexible display apparatus comprising:
   a flexible display panel comprising a first surface, a second surface opposing the first surface, and a side surface that connects the first and second surfaces; and
   a passivation layer disposed on at least one of the first, second and side surfaces of the display panel, wherein the passivation layer comprises a viscoelastic fluid and a vessel unit that fully surrounds and encloses the viscoelastic fluid therein.

2. The flexible display apparatus of claim 1, wherein the viscoelastic fluid is a non-Newtonian fluid.

3. The flexible display apparatus of claim 1, wherein the vessel unit comprises at least one division part that divides the viscoelastic fluid into at least two parts.

4. The flexible display apparatus of claim 3, wherein the vessel unit comprises i) a first vessel unit comprising at least one first division part that defines the viscoelastic fluid and ii) a second vessel unit that is disposed to cross the first division part and comprises at least one second division part.

5. The flexible display apparatus of claim 1, wherein the vessel unit is flexible.

6. The flexible display apparatus of claim 1, wherein the display panel is configured to display an image on the first surface and wherein the passivation layer is disposed on the second surface.

7. The flexible display apparatus of claim 6, wherein the passivation layer is disposed so as to surround the second surface and the side surface.

8. The flexible display apparatus of claim 1, further comprising a touch panel disposed on any one surface of the first surface and the second surface of the display panel, on which an image is displayed.

9. The flexible display apparatus of claim 1, wherein the passivation layer is disposed so as to surround the side surface of the display panel.

10. The flexible display apparatus of claim 1, wherein the display panel comprises i) a display region in which an image is displayed and ii) a non-display region that is located outside the display region, and wherein the passivation layer is disposed on a region corresponding to the non-display region.

11. The flexible display apparatus of claim 1, wherein the display panel comprises:
    a flexible substrate;
    an organic light-emitting device disposed on the flexible substrate; and
    an encapsulation thin film that encapsulates the organic light-emitting device.

12. The flexible display apparatus of claim 1, wherein the viscoelastic fluid comprises at least one of a colloid solution, a silicon polymer solution, and a viscoelastic polymer solution.

13. A method of manufacturing a flexible display apparatus, the method comprising:
    preparing a flexible display panel comprising a first surface, a second surface facing the first surface, and a side surface that connects the first and second surfaces; and
    forming a passivation layer disposed on at least one of the first, second and side surfaces of the display panel, wherein the passivation layer comprises a viscoelastic fluid and a vessel unit that fully surrounds and encloses the viscoelastic fluid therein.

14. The method of claim 13, wherein the forming comprises forming a passivation layer comprising a vessel unit, and wherein the vessel unit comprises at least one division part that divides the viscoelastic fluid into at least two parts.

15. The method of claim 14, wherein the vessel unit comprises i) a first vessel unit comprising at least one first division part that defines the viscoelastic fluid and ii) a second vessel unit that is disposed to cross the first division part and comprises at least one second division part.

16. The method of claim 13, wherein the display panel is configured to display an image on the first surface, and wherein the passivation layer is disposed on the second surface.

17. The method of claim 16, wherein the passivation layer is disposed so as to surround the second surface and the side surface of the display panel.

18. The method of claim 13, further comprising forming a touch panel on any one surface of the first surface and the second surface of the display panel, on which an image is displayed.

19. The method of claim 13, wherein the passivation layer is disposed so as to surround the side surface of the display panel.

20. The method of claim 13, wherein the display panel comprises i) a display region in which an image is displayed and ii) a non-display region that is located outside the display region, and wherein the passivation layer is disposed on a region corresponding to the non-display region.

21. The method of claim 13, wherein the preparing comprises:
    forming an organic light-emitting device on a flexible substrate; and
    forming an encapsulation thin film that encapsulates the organic light-emitting device.

* * * * *